(12) United States Patent
Gelbart

(10) Patent No.: US 6,641,772 B2
(45) Date of Patent: *Nov. 4, 2003

(54) METHOD OF FORMING OBJECTS FROM THERMOSENSITIVE COMPOSITION

(75) Inventor: Daniel Gelbart, Burnaby (CA)

(73) Assignee: Creo Srl, Burnaby (CA)

( * ) Notice: Subject to any disclaimer, the term of this patent is extended or adjusted under 35 U.S.C. 154(b) by 309 days.

This patent is subject to a terminal disclaimer.

(21) Appl. No.: 09/795,145

(22) Filed: Mar. 1, 2001

(65) Prior Publication Data

US 2002/0056945 A1 May 16, 2002

Related U.S. Application Data

(63) Continuation-in-part of application No. 09/317,076, filed on May 18, 1999, now Pat. No. 6,214,276.

(51) Int. Cl.⁷ .......................... B29C 35/08; B29C 41/02; B29C 71/02; H05B 61/00
(52) U.S. Cl. ...................... 264/401; 264/236; 264/308; 264/482; 264/492; 264/494
(58) Field of Search .................................. 264/236, 308, 264/401, 482, 492, 494

(56) References Cited

U.S. PATENT DOCUMENTS 4,929,402 A  5/1990 Hull ........................... 264/401

FOREIGN PATENT DOCUMENTS

WO  92/00185 A1  1/1992

OTHER PUBLICATIONS

Huang, J. et al. *Thermal Imaging: Application in Offset Printing Plate Making.* IS&T NIP Fourth International Conference, 1998.

Primary Examiner—Leo B. Tentoni
(74) Attorney, Agent, or Firm—Oyen Wiggs Green & Mutala

(57) ABSTRACT

Three dimensional objects are formed by scanning a liquid thermosensitive resin with a laser beam causing imagewise heating of the resin. Because thermosensitive compositions do not obey the law of linear superposition, the problem of stray exposure is eliminated allowing the thermal polymerization of any point within the volume of the liquid without affecting adjacent points.

28 Claims, 3 Drawing Sheets

METHOD OF FORMING OBJECTS FROM THERMOSENSITIVE COMPOSITION

CROSS REFERENCE TO RELATED APPLICATION

This application is a continuation-in-part to an application entitled "Method of Forming Objects from Thermosensitive Composition"U.S. patent application Ser. No. 09/317,076 filed on May 18, 1999, now U.S. Pat. No. 6,214,276.

FIELD OF THE INVENTION

The invention relates to the generation of three-dimensional objects by imaging, a field also known as stereolithography, and in particular to thermal stereolithography of various objects, including flexographic printing plates.

BACKGROUND OF THE INVENTION

The generation of three dimensional (3D) objects by imaging a liquid resin is well known and has been commercially available for many years. Typically the liquid resin is made to polymerize in areas exposed to intense UV light from a laser or a mask illuminated by a UV lamp. The two best known applications are building 3D models by a process known as stereolithography and manufacturing flexographic printing plates. Flexographic printing plates are printing plates having considerable surface relief.

Previous methods for creating a 3D object by imaging a liquid resin use a photonic principle. Such processes fall under what is known as the "Law of Reciprocity". This law states that imaging for a long time using a low intensity light will give the same result as imaging for a short time using a high intensity light, as long as the exposure (defined as the integral of the light intensity over time) stays the same. A different way to state this behaviour is to say that the exposure process falls under the law of linear superposition. The law of linear superposition states that: $f(a+b)=f(a)+f(b)$. Simply stated, the combined exposure (a+b) yields the same result as exposure "a" followed by exposure "b". There are some polymerization processes which deviate from the "Law of Reciprocity" such as two-photon absorption processes, in which the rate is proportional to the square of the intensity. Such processes still integrate light and suffer from very low sensitivity requiring high amounts of UV light.

Because of this behaviour, it is not possible to focus an exposure deep inside a liquid resin without also exposing the volume above the desired exposure point. This is shown in FIG. 1. When beam 3 is focused by lens 4 to a point 5 inside liquid resin 1 to polymerize resin 1 at point 5, the area above point 5 will undergo polymerization as well. As point 5 moves along a line inside the liquid resin, points in the immediate vicinity of the line along which point 5 moves, the resin are subject to intense exposure for a short time. The volume 6 above the line through which the exposing light passes before reaching point 5 is subjected to a weak exposure for a longer time (due to the large overlap of the beams forming point 5). Since the product of intensity and exposure is about the same in volume 6 as it is along line 5, volume 6 will polymerize as well. If the absorbance of material 1 is high, volume 6 will actually receive a higher exposure than the desired area along the line travelled by point 5 as point 5 is scanned to cover a large area. Volumes deeper in the fluid 1 than point 5 will be exposed as well. These volumes will receive lower exposures since part of the light is absorbed before it reaches those volumes.

For these reasons, prior art systems can only expose the top layer of a liquid polymer and require elaborate means to lower the polymerized layer and keep it submerged, in order to build an object layer-by-layer, always exposing only the top layer.

A new class of material known as thermosensitive, or thermal, materials has become available. Some thermosensitive materials solidify upon heating to a temperature in excess of a threshold temperature. Thermosensitive, or thermal, materials include both polymerizable materials ("resins") and coalescent materials. Thermosensitive coalescent materials typically comprise small particles which coalesce upon the material reaching a threshold temperature. At temperatures below the threshold thermosensitive materials remain fluid. Because of this property thermosensitive materials operate completely outside the "Law of Reciprocity" or the principle of linear superposition. An example of a thermosensitive process is melting. A block of lead can be melted by heating it up to 500° C. but cannot be melted by heating it up twice to 250° C. If kept at 250° C. for even a long time the lead block will remain solid. This non-integrating behavior is typical of all thermosensitive materials.

Methods have been known since the 1960's for making printing plates involving the use of imaging elements that utilize heat-driven processes rather than photosensitivity. U.S. Pat. No. 3,476,937, Vrancken, discloses a process for making printing plates by imaging particles of thermoplastic polymer in a hydrophilic binder. The particles coalesce under the influence of heat, or heat and pressure. This process is used in heat-based lithographic plates that are developed using various aqueous media. U.S. Pat. No. 3,793,025, Vrancken, discloses the addition of a pigment or dye to a thermosensitive material in the process of Vrancken '937. The pigment or dye converts visible light to heat. U.S. Pat. No. 4,004,924, Vrancken, further discloses the use of hydrophobic thermoplastic polymer particles in a hydrophilic binder together with a light-to-heat converter. In Vrancken '924, the combination is employed specifically to generate printing masters by flash exposure. Various systems for using thermal coalescing materials to make lithographic printing plates are known. One example of a thermal coalescing material used for these purposes is Thermolite™ available from Agfa of Mortsel, Belgium.

Thermal coalescent materials typically comprise a suspension or latex of particles which coalesce to form a larger solid mass upon heating. Typically, coalescent materials comprise a suspension of uncoalesced hydrophobic thermoplastic polymer particles mixed with a component which converts electromagnetic radiation to heat. Macroscopically, coalescent materials appear as a liquid which solidifies locally upon being heated beyond a threshold temperature.

Some prior art processes use laser heating for stereolithography by cutting thin sheets or melting a thin layer of powder. However, neither process is suitable for true 3D imaging as the materials used will scatter the light. These processes it can only be used to form objects in thin layers. Furthermore, in these processes the material starts off as a solid and the heat turns it into a liquid or gas.

SUMMARY OF THE INVENTION

This invention exploits the fact that the exposure of thermosensitive materials does not obey the law of superposition or the law of linear superposition. Three-dimensional objects are created inside a volume of liquid thermosensitive material by 3D scanning of the volume using a focussed light beam, preferably in the IR part of the spectrum. The focussed light beam heats the thermosensitive material to a high temperature in the immediate vicinity of the focal point. The thermosensitive material solidifies rapidly at the points the light is focussed, due to the high temperature, but heats up only slightly in all other areas. As the beam is scanned the areas where temperatures have not reached threshold of the thermosensitive material cool down. The exposure is not integrated in these areas. The unexposed parts of the thermosensitive material may be heated repeatedly to temperatures lower than the threshold temperature without solidifying.

The efficiency of the process can be further increased by providing multiple beams, from different directions, which converge on a common point. This also allows nearly constant exposure through the volume of the thermosensitive material.

BRIEF DESCRIPTION OF THE DRAWINGS

In drawings which illustrate non-limiting embodiments of the invention:

FIG. 3-c shows the polymerization rate a typical coalescent thermosensitive material as a function of temperature; and, FIG. 4 shows a cross-section of stereolithography apparatus using multiple radiation beams being applied to heat up a point inside a thermosensitive material.

DETAILED DESCRIPTION OF THE PREFERRED EMBODIMENT

In this disclosure, the term "thermosensitive material" should be broadly understood as any material capable of being converted from a liquid into a solid by heating to a temperature in excess of a threshold temperature. Thermal materials include resins which solidify by way of temperature-dependent chemical reactions and coalescent materials.

The word "curing" in this disclosure should be understood in a broad sense as any process causing solidification. Curing can be achieved by coalescing, cross-linking or polymerization but the invention should be interpreted broadly to include any type of temperature-induced solidification of a liquid or gel.

Figure 1:
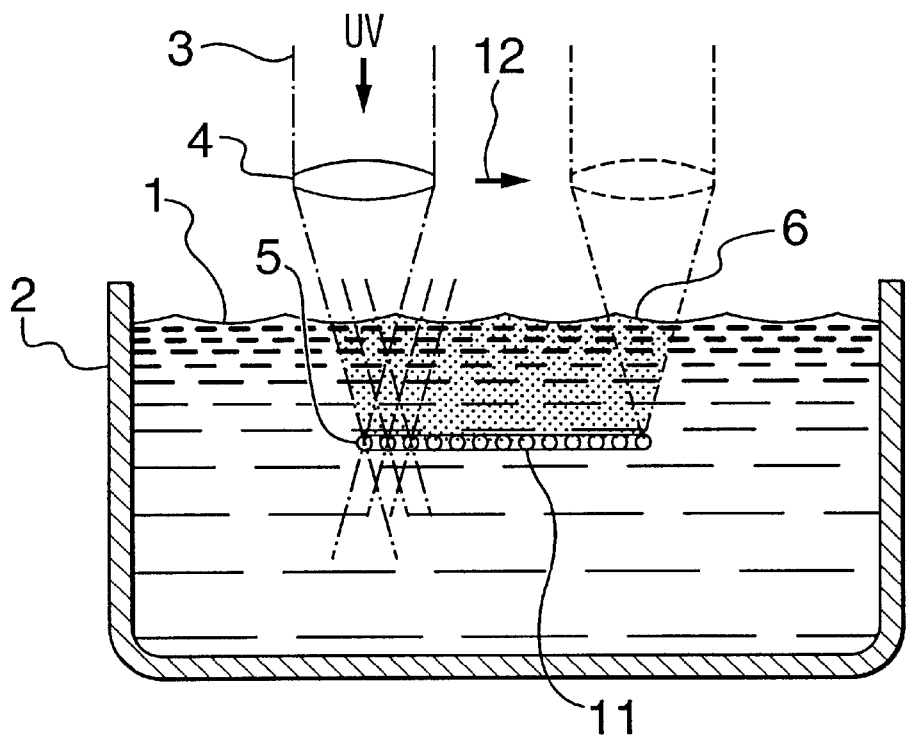
FIG. 1 is a cross-section of a prior art stereolithography apparatus illustrating the problem of exposing a layer of photosensitive resin located below the surface of the resin.
Figure 2:
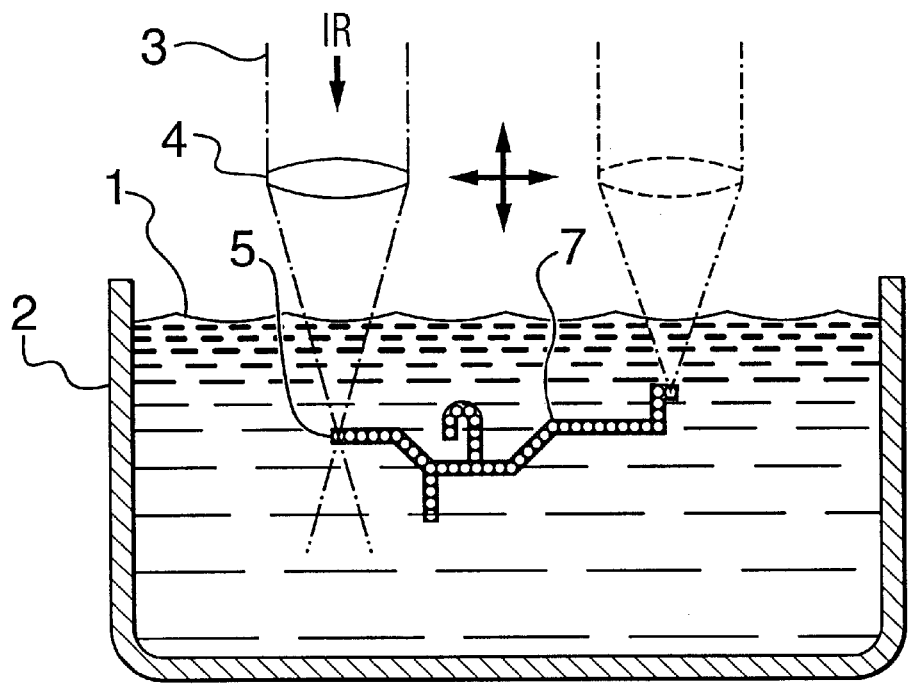
FIG. 2 is a cross-section of a stereolithography apparatus using a thermosensitive material.

FIG. 2 shows a vessel filled with a thermosensitive material 1. A laser beam 3, preferably having a wavelength in the IR part of the spectrum, such as 800 nm to 1200 nm, is focussed to a point 5 using lens 4. Non-laser sources could also be used to generate beam 3. Multiple points 5 can be generated simultaneously by the use of multi-channel modulators or light valves. When light valves are used, they can be one or two-dimensional.

Thermosensitive material 1 absorbs the radiation from laser beam 3 (or other light source) and converts it to heat. The thermosensitive material 1 preferably includes a radiation-to-heat converter chosen to match the wavelength of beam 3. The ability to match the absorbing properties of the material to the available wavelength makes such thermosensitive materials more flexible in use than photonic materials. Beam 3 may comprise radiation in almost any part of the spectrum, as long as an appropriate radiation-to-heat converter is provided in the thermosensitive material. In this respect, a variety of additives suitable for use as radiation-to-heat converters are available and are well known to those skilled in the art. The radiation-to-heat converter may be a suitable dye, pigment or other suitable material capable of absorbing electromagnetic radiation and converting it into heat. The concentration of the radiation-to-heat converter is selected to permit proper exposure of points 5 at a desired depth with the available radiation power. Lasers which emit radiation at wavelengths of 800 nm to 1200 nm are currently most economical and, as a result, are preferred.

At the point of focus 5 thermosensitive material 1 heats up rapidly and solidifies. By scanning spot 5 throughout the volume of thermosensitive material 1, a 3D object 7 is created. Thermosensitive material 1 does not solidify in areas outside the volume of object 7 as in these areas thermosensitive material 1 did not reach the threshold temperature and cooled back down. Even if an area is scanned multiple times there is no accumulated effect.

Figure 3A:
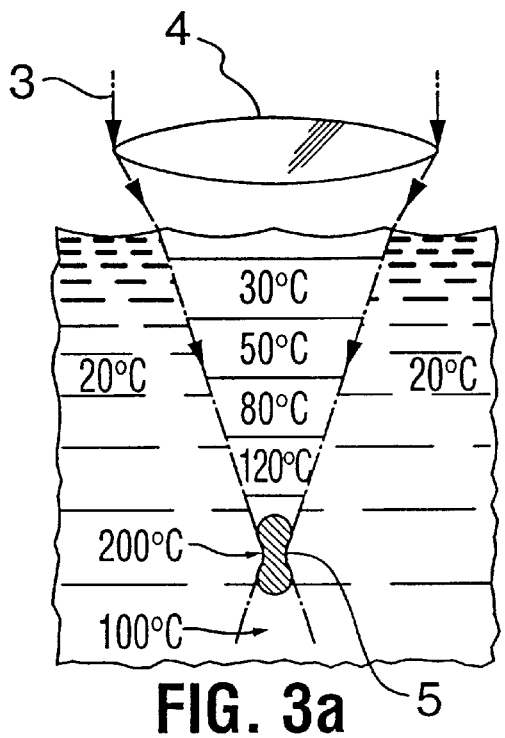
FIG. 3-a and 3-b show the temperature distribution in a volume of a typical thermosensitive resin during an exposure.
Figure 3B:
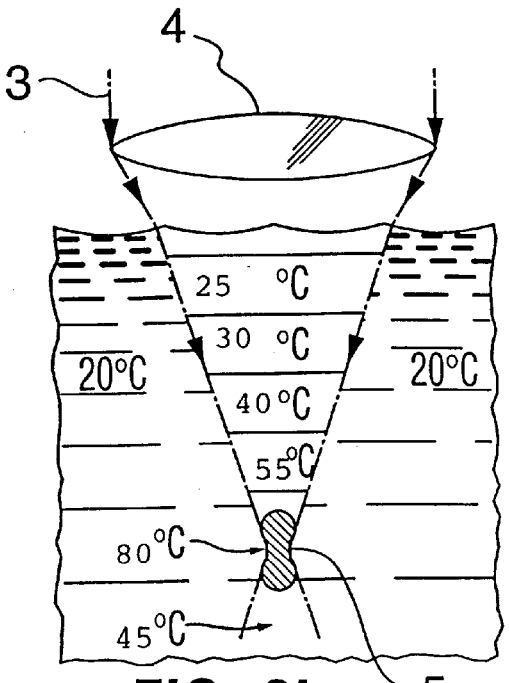
Figure 3C:
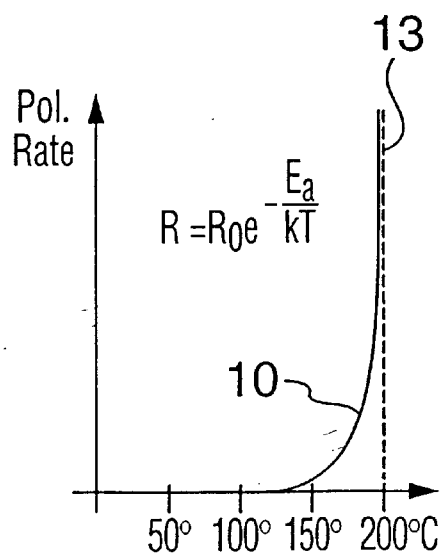

FIG. 3-a shows an example of a possible temperature distribution inside a polymerizable thermosensitive material 1 when laser beam 3 is focused on a spot 5. Because of the high concentration of radiation at spot 5, only thermosensitive material 1 in the immediate vicinity of spot 5 gets sufficiently hot to cause thermosensitive material 1 to polymerize. In order to produce a very localized effect the angle of the cone of radiation formed by lens 4 should be large, preferably in the range of 30° to 90°. This also increases the optical resolution of the system. FIG. 3-b shows a temperature distribution suited to typical coalescing thermosensitive materials. Coalescing thermosensitive materials generally have lower threshold temperatures than do polymerizing thermosensitive materials.

FIG. 3-c is a graph showing the polymerization rate of a typical polymerizing thermosensitive material 1 as a function of temperature. In general only materials involving a physical change, such as melting, have ideal threshold behaviour in which the material changes its state suddenly upon being heated past the threshold temperature. Most polymerizing thermosensitive materials follow the Arrhenius law and have graphs of polymerization rate as a function of temperature similar to line 10. The Arrhenius law states that the rate of a chemical reaction generally follows the equation:

$$R = Ro e^{-\left(\frac{E_a}{kt}\right)} \text{ where}$$

$R$ = rate;
$Ro$ = rate constant;
$E_a$ = activation energy;
$k$ = Boltzmann's constant; and
$t$ = temperature in degrees Kelvin.

In practice, when $E_a$ is sufficiently high, graph 10 is sufficiently close to the ideal graph (i.e. a flat graph followed by a steep step at threshold value 13). For most polymerizing thermosensitive materials, a drop in temperature of 50° C. will slow the reaction by a factor of about 30 fold, and a drop of 100° C. will slow the reaction down by about 1000 fold. For coalescing thermosensitive materials, a small drop in temperature below the material's threshold temperature will dramatically slow down the coalescence rate. In order to make a thermosensitive material as sensitive as possible it is desired to make its threshold temperature 13 as low as possible (but normally above room temperature). For Arrhenius type coalescent resins, this conflicts with the desire to use a coalescent resin which has a long shelf life. This problem can be solved by mixing together two components, such as a liquid comprising a radiation-to-heat absorber on the one hand, and a liquid comprising hydrophobic thermoplastic polymer particles one the other hand, just before use.

Many existing two-component adhesives and casting resins such as epoxies, polyurethane, polyesters and silicone rubber resins can be used as polymerizable thermosensitive materials. If the amount of catalyst is low the curing time is slow without heating. By adding a suitable radiation-to-heat converter such as an absorber dye or pigment and selectively heating with a laser, curing (polymerization) will only occur at points on which the beam is focused. Another family of thermosensitive resins is based on Thermal Acid Generators, in which the high temperature generates an acid, which serves as a catalyst for polymerization. These materials are very similar to the existing photosensitive resins which use a Photo Acid Generator. In the preferred embodiment the laser is a diode laser operating between 800 nm and 1200 nm, typically 830 nm. To get the correct absorption the thermosensitive material is mixed with a radiation-to-heat converter such as an IR absorber dye (available from Zeneca Ltd., U.K. and other vendors). The amount of catalyst and radiation-to-heat converter may be chosen as follows:

A. After mixing with the catalyst the thermosensitive material should stay liquid until the imaging is complete, in order to be able to pour away the liquid portion of the thermosensitive material. This dictates using typically 1%–25% of the amount of catalyst used for normal room-temperature curing. The exact amount is selected according to the longest imaging time required. More catalyst allows less time for handling and imaging but increases the sensitivity of the thermosensitive material.

B. The amount of radiation-to-heat converter is selected according to the depth of the liquid thermosensitive material. Typical absorbance is between A=0.3 to A=3 for the whole thickness (i.e. total transmission between 50% and 1%). Less absorbance creates more uniform polymerization at lower sensitivity.

C. Many polymerizing thermosensitive materials are exthothermic when polymerizing. This is desirable as it increases sensitivity.

D. For best results the thermosensitive material should be prepared just prior to use.

E. It is preferred to build very thick objects up from a few thinner sections, which can be fused together using a resin as an adhesive. This allows the use of a higher concentration of radiation-to-heat converter, for greater sensitivity.

Figure 4:
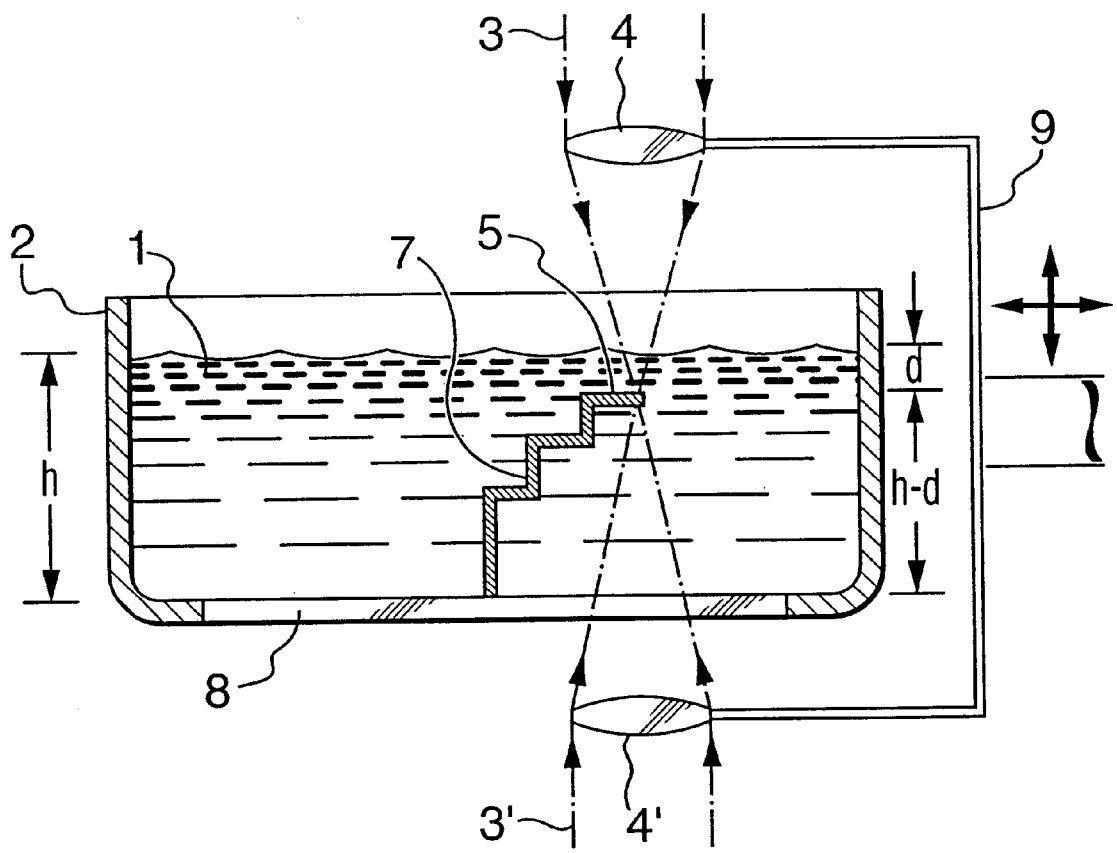

In order to achieve more uniform solidification, it is desired to focus the radiation from different directions. This is shown in FIG. 4. Vessel 2 has a window formed by a transparent bottom well 8. Two laser beams, 3 and 3', focussed by lenses 4 and 4', come to focus at the same spot 5. Spot 5 can be scanned in three dimensions within the volume of thermosensitive material 1 to create 3D object 7. Lenses 4 and 4' are mounted on a common frame 9. All other optical components required to feed radiation beams 3 and 3' to the scanning lenses are not shown, as they are well known in the art of laser scanning.

It should be noted that the focal point of beam 3 shifts as it enters thermosensitive material because thermosensitive material 1 has a refractive index higher than air. If beam 3 is passing through a thickness d of thermosensitive material, its focal spot 5 will shift by about d (n−1)/n, where "n" is the refractive index of thermosensitive material 1. The focal point of beam 3' will shift in a similar manner by (h−d)(n−1)/n. Since the sum of the shifts is d(n−1)/n+(h−d)(n−1)/n= h(n−1)/n, which is independent of d, both beams will always stay in focus as long as the distance between lenses 4 and 4' is compensated by the amount h(n−1)/n. A similar compensation takes place in the amount of energy reaching spot 5. If the total transmission of the full thickness "h" is "T", when spot 5 is at the top or bottom of the vessel the amount of radiation is I+I×T=I(1+T), where I is the intensity of beam 3 or 3'. The lowest exposure is when spot 5 is midway between top and bottom. Since the transmission of half of thickness "h" is $\sqrt{T}$ (where "T" is expressed as a fraction from 0 to 1), the exposure in the middle is $I\sqrt{T}+I\sqrt{T}=2I\sqrt{T}$. In order to achieve uniform exposure, 1+T needs to be equal to 2 $\sqrt{T}$. This is only possible for T=1, which means no energy absorbed (and no heating). However, for reasonable values of "T" the exposure stays nearly constant. For example, for T=0.5, 1+T=1.5; $2\sqrt{T}$=1.42, which is only about 5% less than 1.5. This shows the advantage of the configuration of FIG. 4 over FIG. 2 as radiation intensity will vary by 50% in FIG. 2 for T=0.5.

For better results, radiation intensity can be adjusted automatically. This is done by keeping the power at spot 5 constant by calculating the total absorption of each beam as a function of the thickness of the thermosensitive material it is passing through. While the invention is not limited to any particular application, it is most useful when the object created is nearly flat, such as relief printing plates. Under these conditions the invention is more efficient as higher absorption (per unit thickness) can be used. Both letterpress (rigid) and flexographic (flexible) printing plates can be produced. While the main advantage of the invention is in the true 3D scanning of a volume of coalescent resin, the use of thermoresist has advantages even when scanning the object one layer at a time, as it allows the use of low cost and powerful diode lasers instead of expensive UV lasers. In a thermal process the wavelength of the laser is of no importance, since it is converted to heat. The ability to use low cost lasers plus the freedom from any concerns of stray radiation or room light is superior to prior art stereolithography even when exposing only the top layer of the thermosensitive material, as done in the prior art.

In some cases, when a polymerizable thermosensitive material is being used, it can be useful to achieve partial polymerization, turning the liquid into a soft gel, before scanning is done. This allows one, for example, to form a flexographic plate by coating a dimensionally stable substrate, such as a metal or polyester sheet, with such a gel and exposing it by shaping the plate into the form of a cylinder, as a cylinder shape is easy to scan by rotating it around its axis. Scanning can be achieved by a single laser, preferably laser diode, an array of laser diodes or a light valve used to form many spots from a single laser. An additional advantage of using a gel is increased sensitivity, as the resin is already partly polymerized before the exposure commences. This disadvantage of a gel over a liquid is that the unused material cannot simply be poured off but has to be removed by washing, scrubbing, etc.

Sometimes a post-curing step is required or desirable to improve the process. Post curing steps are usually done after the unsolidified portion of the thermosensitive material is discarded (or re-used). Post curing can include, but is not limited to, the following: baking (i.e. heating of the 3D object in an oven), UV exposure, washing, surface, treating, painting etc. In certain occasions a pre-curing step such as activation of the liquid thermosensitive material by heating below the threshold can be used.

In some cases where the object being formed is very thin and does not require much vertical resolution, a 3D object can be created by a 2D scan, using the depth-of-focus of the scanning system to create the third dimension. Thin flexographic plates can be created this way using the invention. By the way of example, a 1 mm thick plate with 0.5 mm of relief can be created at a resolution of better than 20 microns, as the depth of focus of a 830 nm laser beam when focussed to a 15 micron spot exceeds 0.5 mm. For more accurate vertical profiling a 3D scan is required; in such a case a smaller spot with lower depth of focus can be used.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A method for forming a three dimensional object comprising:
    (a) providing a volume of a thermosensitive material, the material having a rate of solidification which increases with temperature;
    (b) raising a temperature of at least one interior spot in the volume of the thermosensitive material to a temperature sufficient to cause the thermosensitive material to solidify in the vicinity of the spot; and,
    (c) building a three-dimensional object by repeating the step of raising a temperature of an interior spot in the volume of the thermosensitive material for different spots.

2. The method of claim 1, wherein the thermosensitive material solidifies by coalescing.

3. The method of claim 1, wherein the thermosensitive material comprises a suspension of particles which coalesce upon heating to a temperature exceeding a threshold temperature.

4. The method of claim 1, wherein the thermosensitive material comprises a suspension of hydrophobic thermoplastic polymer particles.

5. The method of claim 1, wherein raising a temperature comprises focussing a beam of electromagnetic radiation on the spot.

6. The method of claim 5, wherein the thermosensitive material comprises a suspension of particles which coalesce upon heating intermixed with a material capable of converting the beam of electromagnetic radiation into heat.

7. The method of claim 1, wherein providing the thermosensitive material comprises mixing particles which coalesce upon heating with a radiation-to-heat converter capable of absorbing electromagnetic radiation from the beam and converting the absorbed radiation into heat.

8. The method of claim 5, wherein the thermosensitive material comprises hydrophobic thermoplastic polymer particles and a radiation-to-heat converter capable of absorbing electromagnetic radiation from the beam and converting the absorbed radiation into heat.

9. The method of claim 1, wherein building up a three-dimensional object comprises simultaneously focussing two or more beams of electromagnetic radiation on the spot.

10. The method of claim 9, wherein one of the two or more beams of electromagnetic radiation is incident on the spot through a window located below a surface of the volume of thermosensitive material.

11. The method of claim 1 comprising simultaneously focussing a plurality of beams of electromagnetic radiation on a plurality of spots within the volume of thermosensitive material.

12. The method of claim 1, wherein raising a temperature of at least one interior spot comprises focussing a beam of radiation on the spot and the thermosensitive material is a material which coalesces upon heating.

13. The method of claim 12, wherein the thermosensitive material is in liquid form.

14. The method of claim 12, comprising simultaneously raising temperatures of a plurality of distinct interior spots in the volume of the thermosensitive material by the use of a light valve and at least one laser diode.

15. The method of claim 12, comprising simultaneously raising temperatures of a plurality of distinct interior spots in the volume of thermosensitive material by simultaneously concentrating radiation from one or more diodes in an array of laser diodes on each of the plurality of spots.

16. The method of claim 12, wherein the radiation has a wavelength is in the range of 800 nm to 1200 nm.

17. The method of claim 12, wherein the thermosensitive material comprises a light-absorbing dye.

18. The method of claim 12, comprising post-curing the object.

19. The method of claim 12, wherein raising the temperature of the spot comprises focussing onto the spot two beams of radiation from different directions.

20. The method of claim 19, wherein the two beams are collinear.

21. The method of claim 20, wherein providing the volume of resin comprises providing a volume of resin in a container having a transparent wall wherein one of the two beams enters the resin through the transparent wall.

22. The method of claim 20, wherein the two beams are focussed by an optical system comprising first and second lenses supported on a common frame and selecting different spots includes moving the frame relative to the volume of thermosensitive material.

23. The method of claim 12, wherein rapidly raising the temperature of the at least one interior spot is carried out while maintaining a temperature of thermosensitive material overlying the spot sufficiently low that the thermosensitive material overlying the spot does not solidify.

24. The method of claim 12, wherein focussing the beam of radiation on the spot comprises causing the beam of radiation to converge on the spot with an angle in excess of 30 degrees.

25. A method for forming a three dimensional object comprising:
    (a) providing a volume of a thermosensitive material;
    (b) raising a temperature of at least one interior spot in the volume by providing radiation converging on the spot;
    (c) allowing the increased temperature of the thermosensitive material in the vicinity of the spot to cause the thermosensitive material to solidify in the vicinity of the spot; and
    (d) building up a three-dimensional object by repeating the step of raising a temperature of an interior spot in the volume of the thermosensitive resin for different adjacent spots.

26. A method for forming a three dimensional object comprising:
    (a) providing a volume of a thermosensitive material having a threshold temperature wherein the thermosen sitive material solidifies rapidly when raised to a temperature in excess of the threshold temperature;

(b) rapidly raising a temperature of an interior spot in the volume of the thermosensitive material to a temperature in excess of the threshold temperature by providing at least one beam of radiation focussed on the spot wherein the increased temperature of the thermosensitive material in the vicinity of the spot causes the thermosensitive material to solidify by coalescing in the vicinity of the spot;

(c) building up a three-dimensional object by repeating the step of raising a temperature of an interior spot in the volume of the thermosensitive material for different spots; and, (d) removing unsolidified resin from the three-dimensional object.

27. The method of claim 26, wherein rapidly raising a temperature of an interior spot in the volume of thermosensitive material to a temperature in excess of the threshold temperature comprises maintaining a volume of the thermosensitive material surrounding the interior spot at temperatures lower than the threshold temperature.

28. The method of claim 26, wherein a rate of solidification of the thermosensitive material as a function of temperature increases sharply the temperature of the thermosensitive material is raised past the threshold temperature.

* * * * *